US012408363B2

(12) United States Patent
Chu et al.

(10) Patent No.: US 12,408,363 B2
(45) Date of Patent: Sep. 2, 2025

(54) SEMICONDUCTOR DEVICE WITH PHOSPHORUS-DOPED EPITAXIAL FEATURES

(71) Applicant: Taiwan Semiconductor Manufacturing Co., Ltd., Hsinchu (TW)

(72) Inventors: Feng-Ching Chu, Pingtung County (TW); Chung-Chi Wen, Taipei (TW); Wei-Yuan Lu, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 176 days.

(21) Appl. No.: 17/869,704

(22) Filed: Jul. 20, 2022

(65) Prior Publication Data
US 2022/0352353 A1   Nov. 3, 2022

Related U.S. Application Data

(62) Division of application No. 16/949,728, filed on Nov. 12, 2020, now Pat. No. 11,862,712.
(Continued)

(51) Int. Cl.
H10D 30/01   (2025.01)
H10D 30/62   (2025.01)
(Continued)

(52) U.S. Cl.
CPC .......... H10D 30/024 (2025.01); H10D 30/62 (2025.01); H10D 30/6211 (2025.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,836,016 B2   9/2014   Wu et al.
8,841,701 B2   9/2014   Lin et al.
(Continued)

FOREIGN PATENT DOCUMENTS

CN   106531806 A   3/2017
CN   107316904 A   11/2017
(Continued)

Primary Examiner — Younes Boulghassoul
(74) Attorney, Agent, or Firm — Haynes and Boone, LLP

(57) ABSTRACT

A method for fabricating a semiconductor device that includes a merged source/drain feature extending between two adjacent fin structures is provided. An air gap is formed under the merged source/drain feature. Forming the epitaxial feature includes growing a first epitaxial feature having a first portion over the first fin structure and a second portion over the second fin structure, growing a second epitaxial feature over the first and second portions of the first epitaxial feature, and growing a third epitaxial feature over the second epitaxial feature. The second epitaxial feature includes a merged portion between the first fin structure and the second fin structure.

20 Claims, 13 Drawing Sheets

Related U.S. Application Data

(60) Provisional application No. 62/978,731, filed on Feb. 19, 2020.

(51) Int. Cl.
  *H10D 62/00* (2025.01)
  *H10D 62/10* (2025.01)
  *H10D 84/01* (2025.01)
  *H10D 84/03* (2025.01)

(52) U.S. Cl.
  CPC ......... *H10D 62/021* (2025.01); *H10D 62/116* (2025.01); *H10D 84/013* (2025.01); *H10D 84/0133* (2025.01); *H10D 84/0158* (2025.01); *H10D 84/038* (2025.01)

(58) Field of Classification Search
  CPC ........... H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823418; H01L 21/823814; H01L 21/823525; H01L 29/0847; H01L 29/7848; H01L 29/66636; H01L 29/66575; H01L 29/0653; H01L 29/4991; H01L 21/764; H01L 21/7682; H01L 21/823468; H01L 21/823864; H01L 29/6656; H01L 29/6653; H01L 29/66553; H10B 12/36; H10B 12/056; H10D 84/0158; H10D 84/0193; H10D 84/834; H10D 84/853; H10D 86/011; H10D 86/215; H10D 30/024–0245; H10D 30/62–6219; H10D 62/151; H10D 62/021; H10D 84/013; H10D 84/0133; H10D 84/017; H10D 30/6713; H10D 30/0223; H10D 30/797
  See application file for complete search history.

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 9,870,926 B1* | 1/2018 | Huang .............. H01L 29/66795 |
| 10,141,431 B1* | 11/2018 | Hung ................. H01L 21/3065 |
| 2015/0084134 A1 | 3/2015 | Lin |
| 2017/0053912 A1* | 2/2017 | Ching .................. H01L 29/785 |
| 2017/0077222 A1* | 3/2017 | Lee ...................... H01L 29/0649 |
| 2017/0141112 A1 | 5/2017 | Ching |
| 2017/0148797 A1 | 5/2017 | Kim et al. |
| 2017/0207126 A1 | 7/2017 | Ching |
| 2017/0256456 A1* | 9/2017 | Lee ...................... H01L 29/7848 |
| 2018/0151698 A1* | 5/2018 | Sung .................. H01L 29/785 |
| 2018/0174912 A1* | 6/2018 | Lee .................. H01L 29/41791 |
| 2018/0175046 A1 | 6/2018 | Chiou |
| 2018/0175172 A1* | 6/2018 | Chang ................. H01L 29/267 |
| 2019/0109217 A1 | 4/2019 | Lin et al. |
| 2019/0148528 A1* | 5/2019 | Yu ...................... H01L 29/42384 |
| | | 257/288 |
| 2019/0148551 A1 | 5/2019 | More |
| 2019/0157155 A1* | 5/2019 | Keng .............. H01L 21/823418 |
| 2019/0164835 A1* | 5/2019 | Lu .................... H01L 29/41791 |
| 2019/0164966 A1* | 5/2019 | Wang ................ H01L 29/7853 |
| 2019/0165143 A1* | 5/2019 | More ............... H01L 29/66492 |
| 2019/0280115 A1* | 9/2019 | Li .................... H01L 21/823431 |
| 2019/0393347 A1 | 12/2019 | Kim et al. |
| 2020/0043793 A1* | 2/2020 | Huang ............... H01L 29/6656 |
| 2020/0044025 A1* | 2/2020 | Liu ................... H01L 29/66545 |
| 2020/0075725 A1* | 3/2020 | Wu ........................ H01L 29/785 |
| 2020/0091146 A1* | 3/2020 | Tsao ..................... H01L 23/535 |
| 2021/0028281 A1* | 1/2021 | Kim ................ H01L 29/66795 |
| 2021/0043730 A1 | 2/2021 | Lee et al. |
| 2021/0135000 A1* | 5/2021 | Liu ................... H01L 29/66545 |

FOREIGN PATENT DOCUMENTS

| | | |
|---|---|---|
| CN | 109326645 A | 2/2019 |
| CN | 109860117 A | 6/2019 |

* cited by examiner

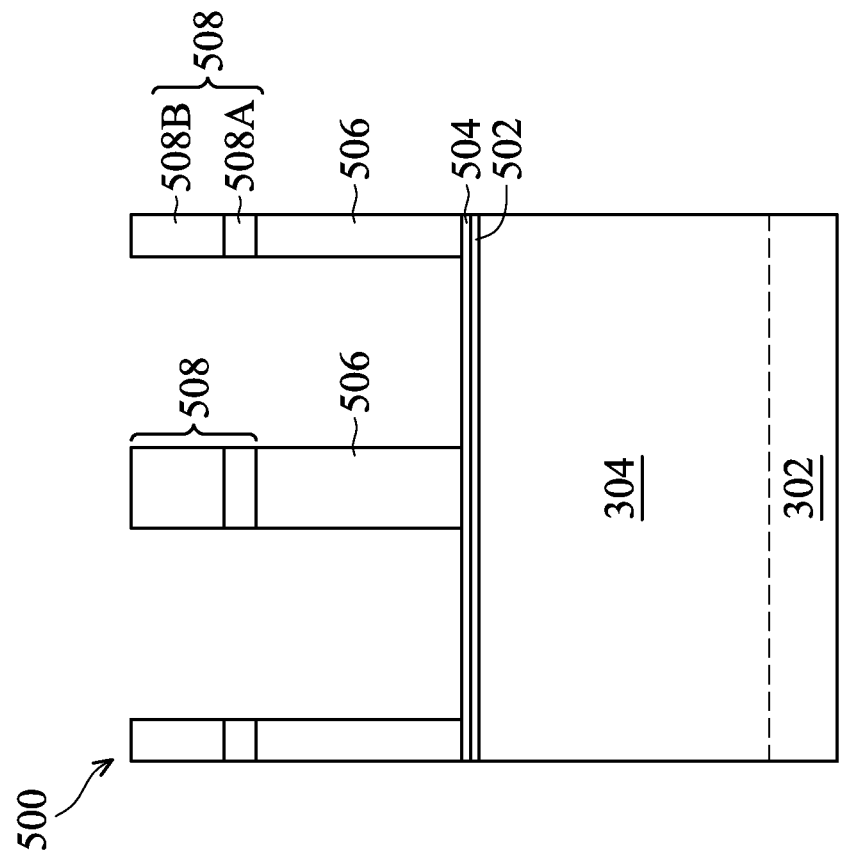
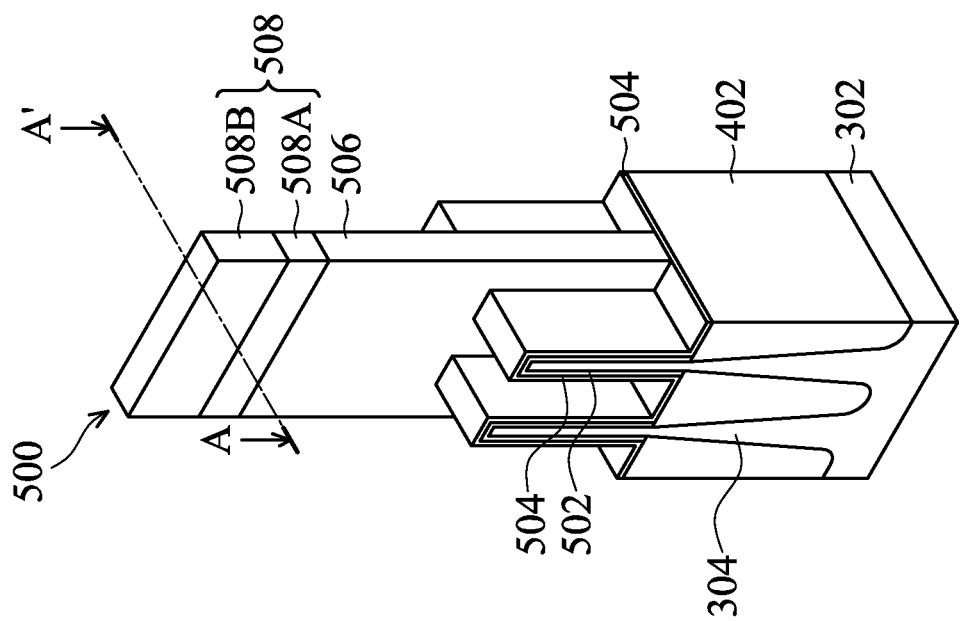
Fig. 5B
Fig. 5A

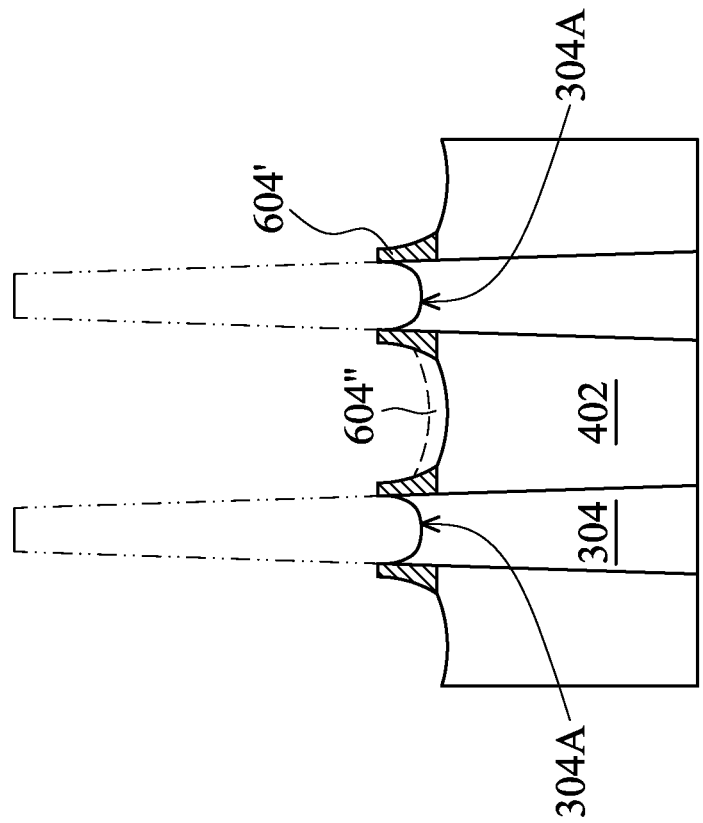
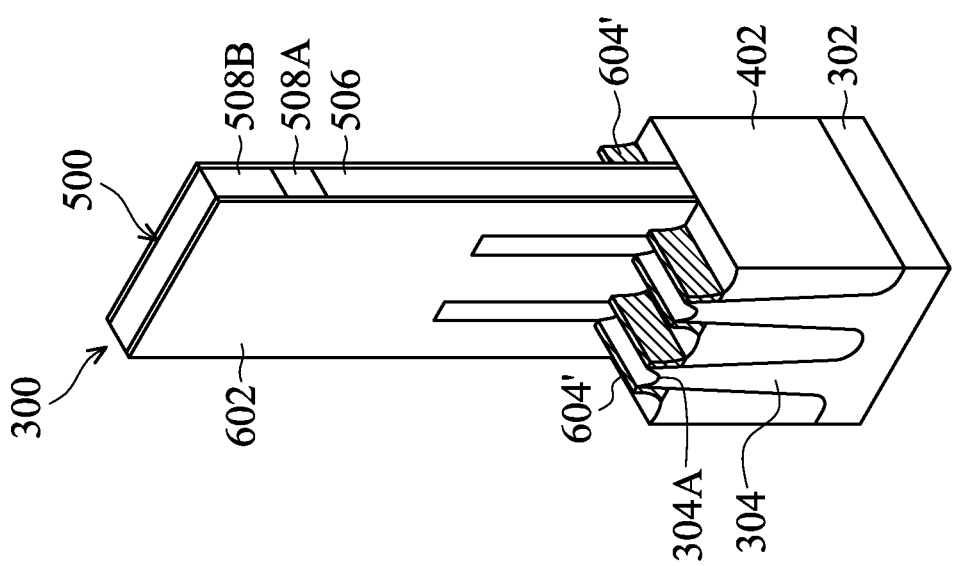
Fig. 7A
Fig. 7B

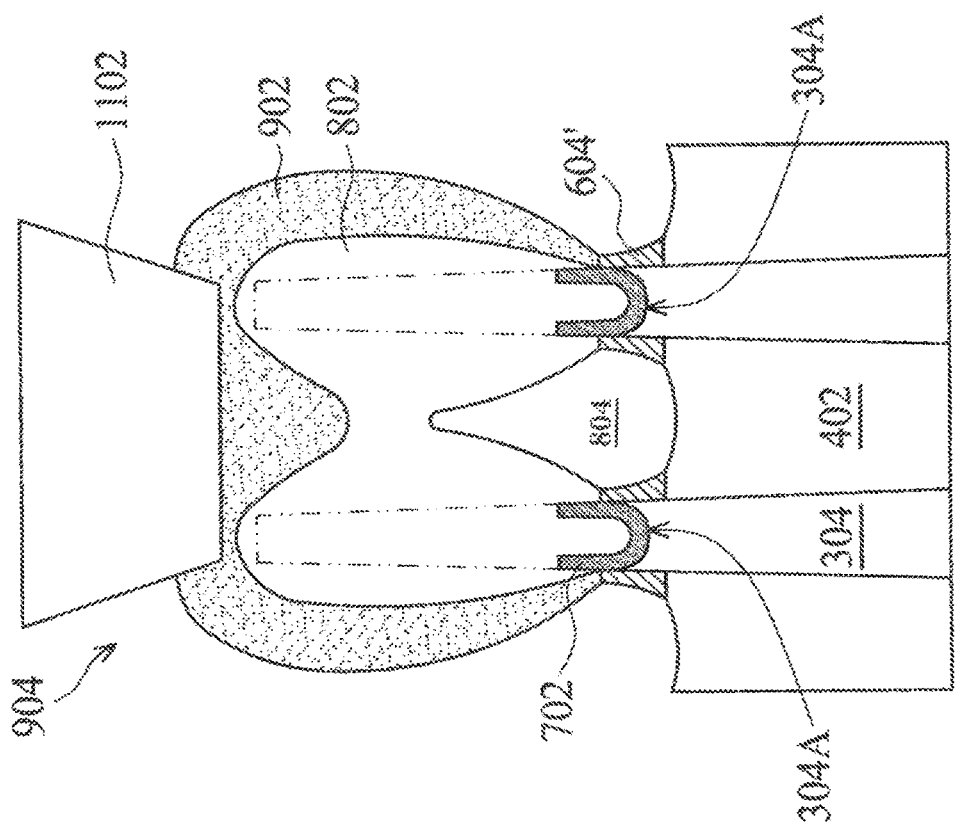

SEMICONDUCTOR DEVICE WITH PHOSPHORUS-DOPED EPITAXIAL FEATURES

PRIORITY DATA

This is a divisional application of application Ser. No. 16/949,728 filed Nov. 12, 2020, which is a non-provisional application of and claims benefit of U.S. Provisional Patent Application Ser. No. 62/978,731, filed Feb. 19, 2020, the entire disclosure of each is incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs.

In various conventional processes, source/drain regions can be epitaxially grown for the FinFETs. In some existing implementations, devices may exhibit larger capacitance than desired due to the structure of the source/drain regions. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5A, 6A, 7A, 7C, 8A, 9A, 10, and 11A are isometric views of an embodiment of a device 300 according to aspects of the method of FIG. 1;

FIGS. 5B, 6B, 7B, 7D, 8B, 9B, and 11B are cross-section views, corresponding to respective isometric views listed above, of an embodiment of the device 300 according to aspects of the method of FIG. 1.

DETAILED DESCRIPTION

Figure 1:
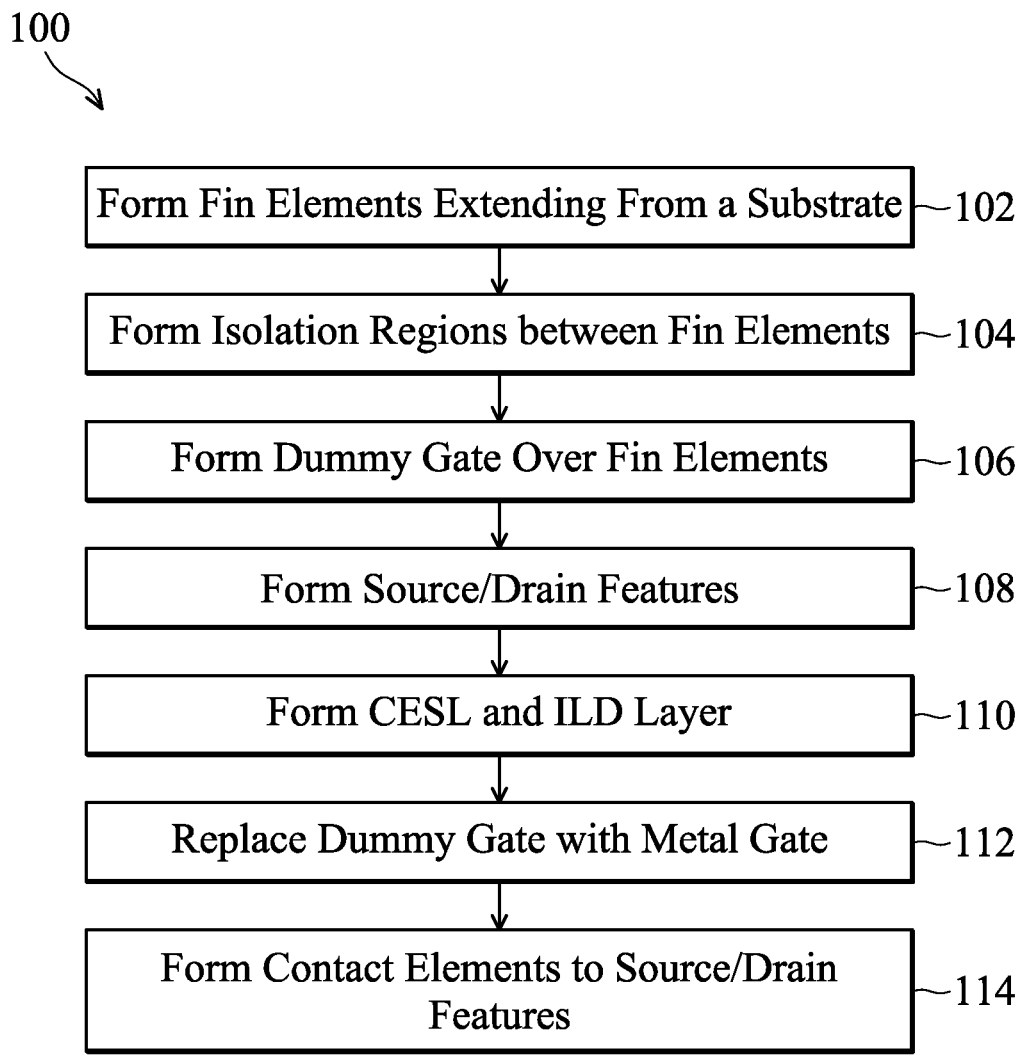
FIG. 1 is a flow chart of a method of fabricating a FinFET device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure is generally related to semiconductor devices and fabrication methods, and more particularly to the formation of devices (e.g., FinFETs) fabricated using epitaxial growth processes for providing a source/drain region, as described in more detail below. However, one of skill in the art would recognize the application to other device types, as discussed above, and also other features of said devices.

Embodiments of the present disclosure offer advantages over the existing art, though it is understood that other embodiments may offer different advantages, not all advantages are necessarily discussed herein, and no particular advantage is required for all embodiments. For example, various embodiments provide a method and related structure for improving capacitance of a FinFET.

Figure 11A:
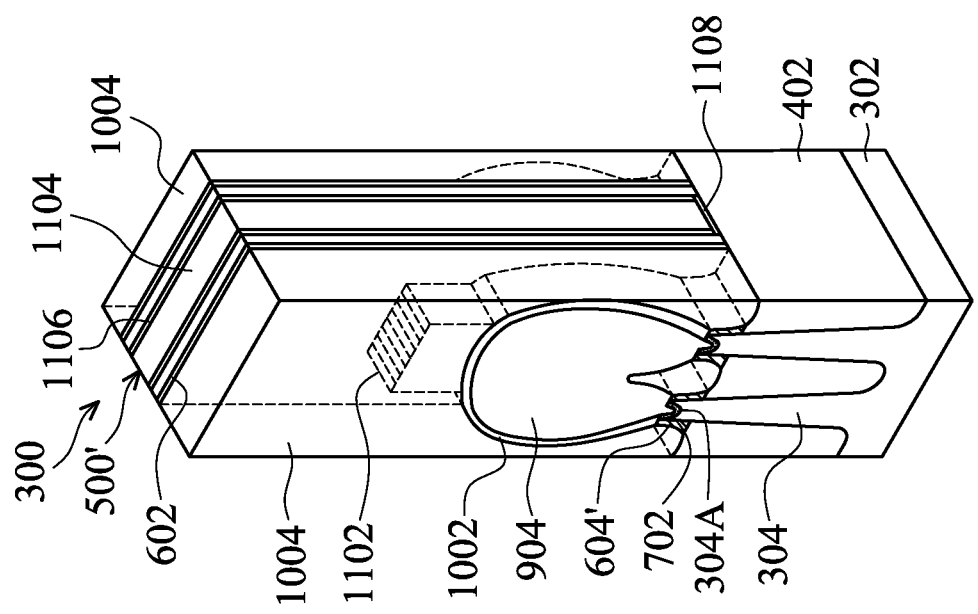
Figure 11C:
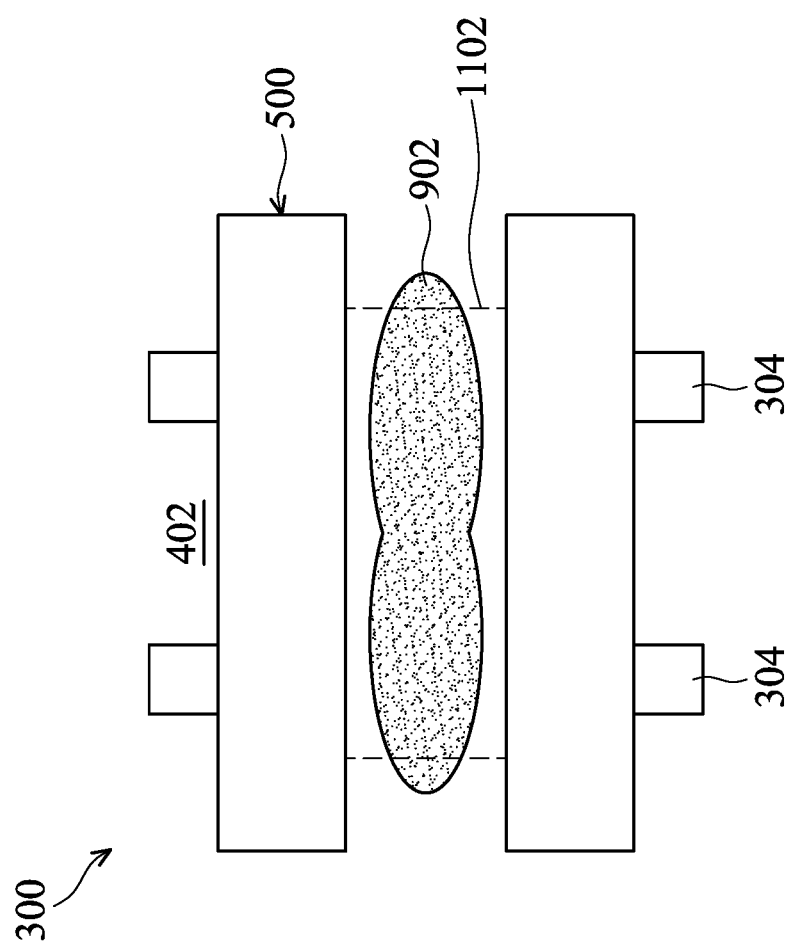
FIG. 11C is a top view, corresponding to respective isometric view listed above, of an embodiment of the device 300 according to aspects of the method of FIG. 1.

Referring now to FIG. 1, illustrated therein is a method 100 for fabricating a device including an epitaxial layer, in accordance with some embodiments. It is understood that the method 100 includes steps having features of a complementary metal-oxide-semiconductor (CMOS) technology process flow and thus, are only described briefly herein. Additional steps may be performed before, after, and/or during the method 100. FIGS. 3, 4, 5A, 6A, 7A, 7C, 8A, 9A, 10, and 11A provide isometric views of an embodiment of a semiconductor device 300 according to various stages of the method 100 of FIG. 1. FIGS. 5B, 6B, 7B, 7D, 8B, 9B, and 11B are cross-section views (e.g., along an exemplary plane A-A', as shown in FIG. 5A), corresponding to respective isometric views listed above, of an embodiment of the semiconductor device 300 according to various stages of the method 100 of FIG. 1. FIG. 11C illustrates a top view a region of the device 300 of FIG. 11A, according to some embodiments. Further, the semiconductor device 300 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

In an embodiment, the device 300 illustrated in the exemplary figures is an n-type FET (nFET). The nFET may be suitable for use in an SRAM application. The device 300 may be a two-fin structure, such that a single gate structure interfaces two fins and the source/drain regions grown on said fins merge.

The method 100 begins at block 102 where fin elements, used for subsequent FinFET formation, are formed extending from a substrate. With reference to the example of FIG. 3, in an embodiment of block 102, a plurality of fin structures 304 extending from a substrate 302 are formed. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include one or more epitaxial layers (epi-layers), may be strained for performance enhancement, may include a silicon-on-insulator (SOI) structure, and/or have other suitable enhancement features.

In some embodiments, an anti-punch through (APT) implant may be performed (e.g., into the substrate 302) prior to formation of the fin structures 304. In some cases, also prior to formation of the fin structures 304, a hard mask (HM) layer(s) 306 may be formed over the substrate 302. The HM layer may include an oxide layer portion 306A (e.g., a pad oxide layer that may include $SiO_2$) and a nitride layer portion 306B (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. By way of example, the oxide layer of the HM layer, 306A, may have a thickness of between approximately 5 nm and approximately 40 nm. In some embodiments, the nitride layer of the HM layer, 306B, may have a thickness of between approximately 20 nm and approximately 160 nm.

The fins 304, like the substrate 302, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 304 may be fabricated using suitable processes including photolithography and etch processes. The photolithography process may include forming a photoresist layer over the substrate 302 (e.g., over an HM layer formed over the substrate 302), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 302, and layers formed thereupon, while an etch process forms trenches 308 in unprotected regions through the HM layer and into the substrate 302, thereby leaving the plurality of extending fin structures 304 with HM layer portion 306 overlying each fin 304. The trenches 308 may be etched using a dry etch (e.g., reactive ion etching), a wet etch, and/or other suitable processes. Numerous other embodiments of methods to form the fins 304 on the substrate 302 may also be used.

The method 100 then proceeds to block 104 where isolation regions are formed between fin elements. With reference to the example of FIG. 4, in an embodiment of block 104, a plurality of isolation regions 402 are formed. In some embodiments, the plurality of isolation regions 402 may include a plurality of shallow trench isolation (STI) features including a dielectric material. By way of example, the dielectric material is first deposited over the substrate 302, filling the trenches 308 with the dielectric material. In some embodiments, the dielectric material may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. In some embodiments, after deposition of the dielectric material, the device 300 may be annealed to improve the quality of the dielectric material. In some embodiments, a field oxide, a LOCOS feature, and/or other suitable isolation features may additionally or alternatively be implemented on and/or within the substrate. However, other embodiments are possible. For example, in some embodiments, the dielectric material (and subsequently formed isolation regions 402) may include a multi-layer structure, for example, having one or more liner layers. After deposition of the dielectric material, the deposited dielectric material is thinned and planarized, for example by a CMP process. In some embodiments, such a CMP process may be used to remove excess dielectric material, planarize a top surface of the device 300, and form isolation regions (e.g., which are subsequently recessed to form the isolation regions 402, as described below).

In some embodiments, the CMP process used to planarize the top surface of the device 300 and form the isolation regions (e.g., prior to recessing the isolation regions) may also serve to remove the HM layer portion 306 or portions thereof from each of the plurality of fin structures 304. In some embodiments, removal of the HM layer portion 306 includes removal of the oxide layer portion 306A and the nitride layer portion 306B in concurrent or separate processes (e.g., CMP). Removal of the HM layer portion 306, including the oxide layer portion 306A and the nitride layer portion 306B, may alternately be performed by using a suitable etching process or processes (e.g., dry or wet etching). Whether by using a CMP process and/or an etching process, upon removal of the HM layer portion 306 from the top of each of the fin structures 304, provides for a top surface of the fin structures 304 (e.g., semiconductor material) to be exposed.

Figure 4:
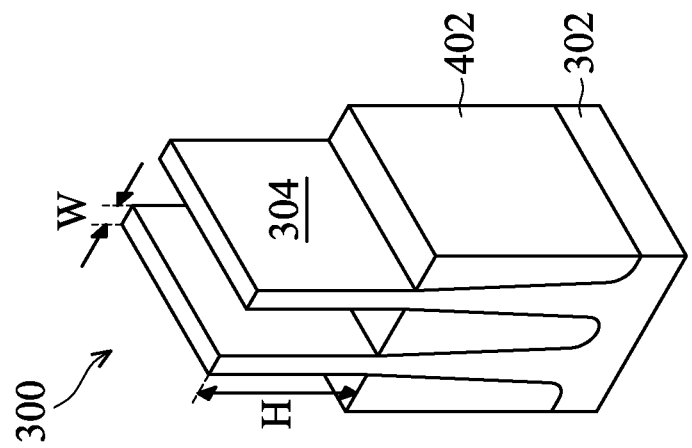
Figure 3:
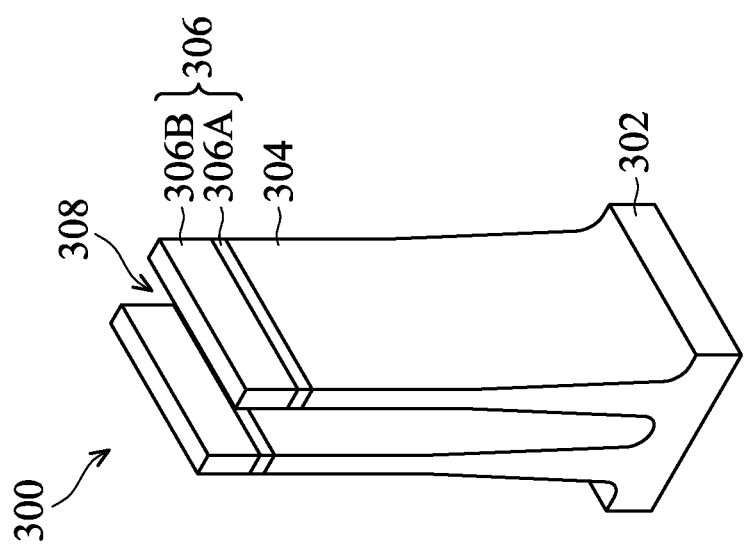
Figure 6B:
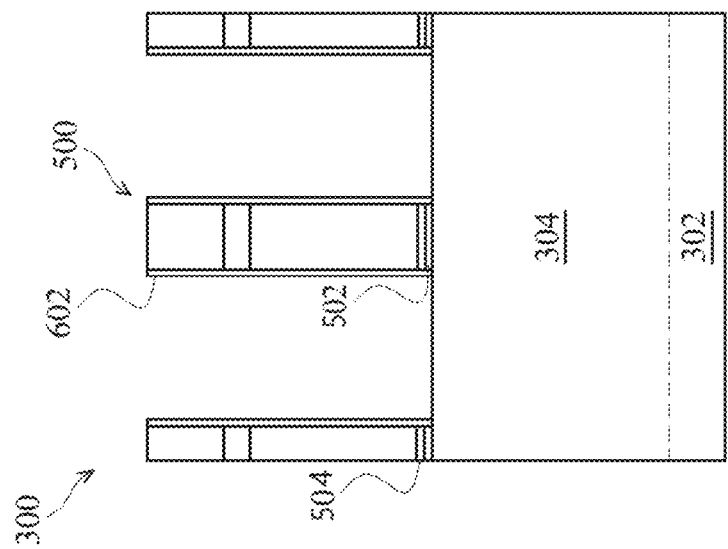
Figure 6A:
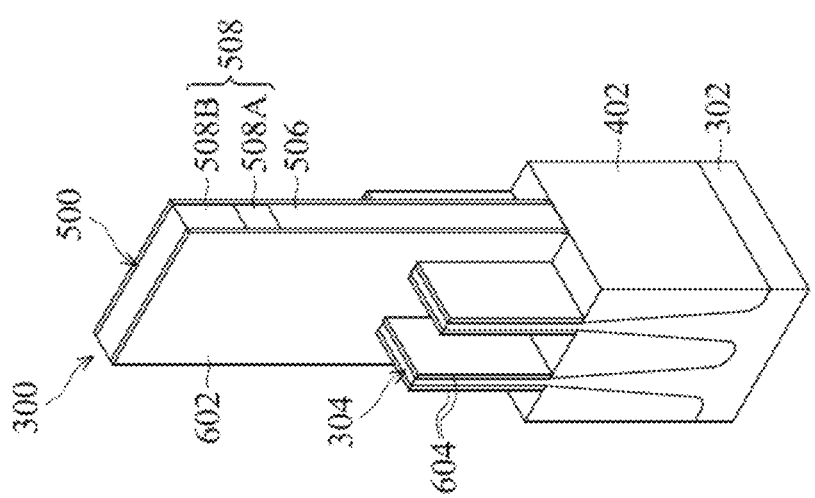

After the CMP process to remove the excess dielectric material and planarize the top surface of the device 300, the isolation regions around the fin structures 304 are recessed to laterally expose an upper portion of the fin structures 304 and form the isolation regions 402 as illustrated in FIG. 4. In various examples, the isolation regions 402 are configured to isolate fin active regions. In some embodiments, the recessing process may include a dry etching process, a wet etching process, and/or a combination thereof. In various embodiments, a recessing depth is controlled (e.g., by controlling an etching time) so as to result in a desired height 'H' of the exposed upper portion of the fin elements 304. In some embodiments, the height 'H' may be between approximately 30 nm-60 nm. In some cases, a fin width 'W' may be between approximately 4 nm-10 nm. The height H and the width W provide for a channel region of the device 300 and thus, are selected to provide suitable device performance (Vth, Ion, Ioff, DIBL, etc.). In some embodiments, at this stage in the process, the isolation regions 402 may have a substantially planar top surface.

The method 100 then proceeds to block 106 where a gate structure is formed over the fin elements. In an embodiment, the gate structure is a dummy gate. In an embodiment, the formation of the gate structure includes forming a gate dielectric layer(s) and gate electrode layer(s), one or more of said layers being sacrificial. With reference to the example of FIGS. 5A and 5B, in an embodiment of block 106, a gate structure 500 is formed. In some embodiments, the gate structure 500 is sacrificial, or in other words, is a dummy gate that is subsequently replaced by a functional gate (e.g., 500' discussed below). The gate structure 500 may include an interfacial layer 502, which is formed over the exposed upper portion of the fin structures 304, a gate dielectric layer 504 is formed over the interfacial layer 502, and an electrode layer 506 is formed over the dielectric layer 504. In some embodiments, one or more of the interfacial layer 502, the gate dielectric layer 504, and the electrode layer 506 are formed conformally over the fin structures 304, including within trenches between adjacent fin structures 304 and subsequently patterned.

In some embodiments, the interfacial layer 502 may include a dielectric material such as silicon oxide ($SiO_2$), HfSiO, or silicon oxynitride (SiON). The interfacial layer 502 may be formed by chemical oxidation, thermal oxidation, atomic layer deposition (ALD), chemical vapor deposition (CVD), and/or other suitable method. In various examples, a thickness of the interfacial layer 502 may be around 0.5-3 nm. The thickness of the interfacial layer 502 affects the equivalent oxide thickness (EOT) of the device 300, an increased thickness can raise the EOT while too thin of an interfacial layer, in some embodiments, can affect the channel integrity (e.g., interfacial trap states). In some embodiments, the interfacial layer 502 is not formed over the isolation region 402. In an embodiment, the dielectric layer 504 includes silicon oxide. Other compositions are also possible including high-k dielectric materials such as hafnium oxide ($HfO_2$), HfZrO, $TiO_2$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer 504 may be formed by chemical oxidation, thermal oxidation, atomic layer deposition (ALD), chemical vapor deposition (CVD), ALD, physical vapor deposition (PVD), and/or other suitable methods. In various examples, a thickness of the gate dielectric layer 504 may be around 1-5 nm. The thickness of the gate dielectric layer 504 affects the performance of the device 300 (capacitance), while too thin of a gate dielectric can cause degradation and breakdown during operation which leads to leakage currents.

In some embodiments, the electrode layer 506 may include polycrystalline silicon (polysilicon). Alternatively, in some embodiments, a metal gate electrode layer may be formed including Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. As discussed above, in some cases, the electrode layer 506 (like the dielectric layer 504 and possibly the interfacial layer 502) is removed in a subsequent replacement gate process, as discussed herein. In other embodiments, the electrode layer 506 is retained and may provide an N-type or P-type work function, for example, depending on whether an N-type or P-type FinFET is being formed. In various embodiments, the electrode layer 506 may be formed by ALD, PVD, CVD, e-beam evaporation, or other suitable process.

In some examples, a hard mask 508 may be formed over the gate electrode layer 506, where the hard mask 508 includes an oxide layer 508A and a nitride layer 508B formed over the oxide layer 508A. In some examples, deposition of the hard mask 508 may be accomplished using CVD, PVD, ALD, thermal oxidation, or other suitable deposition techniques, or a combination thereof. In some embodiments, the oxide layer 508A includes a pad oxide layer that may include $SiO_2$. In some embodiments, the nitride layer 508B includes a pad nitride layer that may include $Si_3N_4$, silicon oxynitride or silicon carbide.

Block 106 includes the deposition of materials as discussed above, and the subsequent patterning of the layers. With reference to the example of FIGS. 5A/5B, the hard mask 508 and the gate electrode layer 506 are patterned to form a gate structure 500 (e.g., using photolithography and etching processes). In some embodiments, the photolithography process may include photoresist coating (e.g., over the hard mask 508), soft baking, mask aligning, exposure, post-exposure baking, photoresist developing, rinsing, drying (e.g., spin-drying and/or hard baking), and/or other suitable lithography techniques, and/or combinations thereof. The photolithography process may provide a patterned photoresist layer which serves as a masking element for the subsequent etching process. The masking element may be used to protect some regions of the device 300, while an etching process (e.g., a dry etch, a wet etch, or combination thereof) etches through unprotected regions of the device 300 including unprotected regions of the hard mask 508 and the electrode layer 506, thereby leaving the (dummy) gate structure 500. In some embodiments, the dielectric layers 502 and/or 504 may also be patterned. In alternative embodiments, the dielectric layers 502 and/or 504 are not patterned.

The method 100 at block 106 may include formation of one or more spacer layers. With reference to the example of FIGS. 6A/6B, in an embodiment of block 106, a spacer material layer is deposited over the substrate 302 including over the gate structure 500. The spacer material layer may, after conformal deposition, be etched back for example exposing a top of the gate 500 (hard mask 508B) to form gate spacers 602. In a same or different process, the spacer material layer be etched back such that the fin spacers 604 of a first height are formed on the fin sidewalls of the source/drain region. In some cases, the spacer layer 602 may be referred to as an offset spacer. In some embodiments, the spacer layer 602 and/or 604 may include a dielectric material such as silicon oxide, silicon nitride, silicon carbide, silicon oxynitride, SiOC, SiOCN, a low-K dielectric material, or combinations thereof. The spacer layer 602 and/or 604 may be formed by chemical oxidation, thermal oxidation, ALD, CVD, and/or other suitable method. In various examples, a thickness of the spacer layer 602 and/or 604 may be around 1-8 nm. The thickness of the spacer layers can define the source/drain positioning with respect to the channel region and/or provide sidewalls for subsequent processes (e.g., replacement gate). In some embodiments after conformal deposition, the spacer layer, high-K gate dielectric layer, and/or interfacial layer are etched-back (or pulled-back) to expose the fin 304 in a source/drain region adjacent the gate structure 500 with the fin spacers 604 on the fin 304 sidewalls in the source/drain region.

Figure 2:
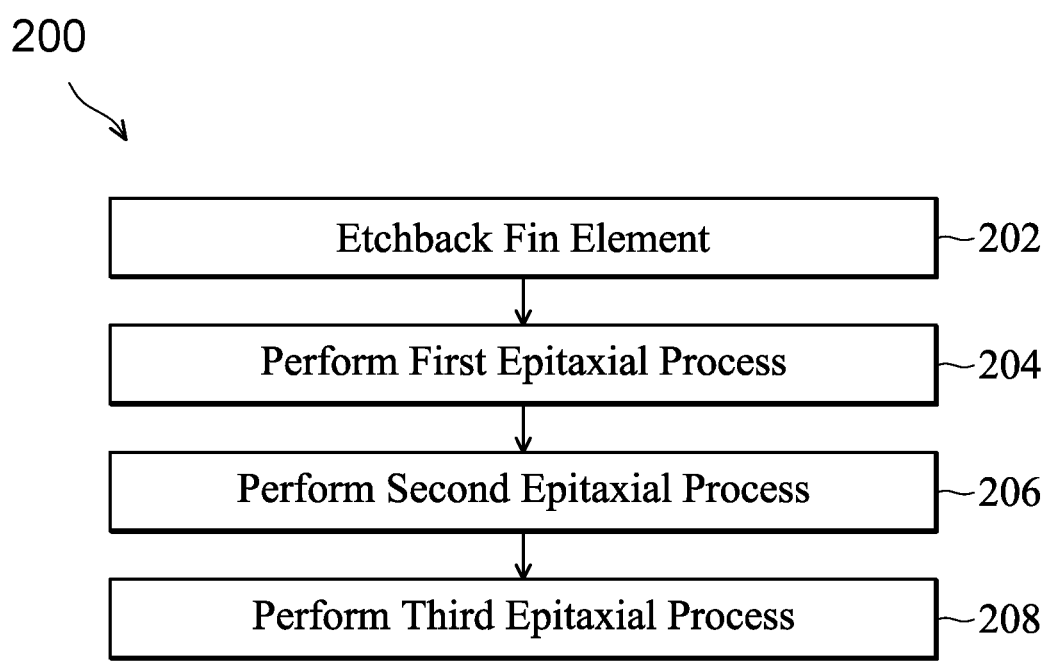
FIG. 2 is a flow chart of a method of forming an epitaxial feature that may be used in conjunction with an embodiment of the method of FIG. 1 according to one or more aspects of the present disclosure.

The method 100 then proceeds to block 108 where source/drain features are formed. The source/drain features are formed in a source/drain region of the fin, which is adjacent the gate structure covering the channel region of the fin. The source/drain features may be formed by epitaxially growth. One example method of forming an epitaxial feature suitable for use as a source/drain feature is illustrated in the method 200 of FIG. 2. FIG. 2 is exemplary method 200 including a three-stage epitaxially growth process. However, in some embodiments, one more of the stages, i.e., additional epitaxial growth processes of the method 200 of FIG. 2 may be omitted.

In an embodiment, the method 200 begins at block 202 where the fin element in the source/drain region is etched back. In some embodiments, block 202 is omitted. For example, a seed area for the subsequent epitaxial growth described below is provided at a top surface of the fin element, without etch back.

Referring to the example of FIG. 7A/7B, the fin structure 304 is selectively etched back to provide a recessed top surface 304A. The recessed top surface 304A provides a seed (e.g., a surface on which epitaxial material nucleates) for subsequent epitaxial growth described below. The recessed top surface 304A is curvilinear surface of the semiconductor material of the fin 304. The recessed top surface 304A may be a curvilinear silicon surface. Specifically, the recessed top surface 304A may include a bottom portion that is Si(100) crystal orientation. The sides of the curvilinear surface 304A may be a different Si crystal orientation, such as Si(111). It is noted that the depicted recessed top surface 304A is substantially adjacent the top surface of the isolation feature 504. However, in other embodiments, the recessed top surface 304A may be below a top surface of the isolation structure 504. In yet other embodiments, the recessed top surface 304A may be above a top surface of the isolation structure 504. Fin spacers 604' material may remain above the isolation features abutting the previously present sidewalls (now recessed) of the fin structure 304 and be adjacent the recessed top surface 304A. It is noted that as illustrated in FIG. 7A/7B, the fin spacers 604' have been etched back from the initial height of fin spacers 604 in FIGS. 6A/6B. The etch back process may be separate process than that of the recessing of the fin structure 304. In some embodiments, the fin spacers 604' are maintained on both the inner sidewalls and the outer sidewalls of the previously disposed fin 304. The height of the inner and outer fin spacers 604' may differ. In an embodiment, the height of the inner spacer 604', as shown, may be less than the height of the outer spacer 604'. In an embodiment, the inner fin spacers 604' may connect between adjacent fins, as shown as outline 604" in FIG. 8B. In other words, the portion of the spacer material 604 above the isolation material 402 between adjacent fins may remain.

The etching back process of the fin structure 304 may be performed by a wet etching process, a dry etching process or combinations thereof. It is noted that an outline of the fin 304, removed in some embodiments that include etching back, is provided for ease of reference as a dotted line in FIG. 7B. The etching back process of the fin structure 304 may be selective to the fin material leaving the surrounding dielectrics substantially unetched.

Some processes such as the etching back of the fin spacers 604 and, in some embodiments, though possibly to a lesser extent, the etch back of the fin 304, may lead to loss (etching) of the isolation structures 402. This is illustrated by the non-planar surface of the isolation features in FIGS. 7A/7B. The isolation structures 402 may be between approximately 17 to 20 nm below the seed area, surface 304A. The isolation structure 402 may be approximately a distance t below the recessed fin surface 304A. In an embodiment, "t" is between approximately 17 and 20 nm. The distance 't' affects the crystalline growth properties including the flexibility of the fin structure on which the epitaxy is subsequently grown and the thickness of epitaxial material that is to be growth before merging, which affects device performance as discussed below. The isolation features 402 may exhibit a circulinear or concave surface as illustrated, for example, in FIG. 7B.

The method 200 then proceeds to include a three-stage process that forms a first epitaxial layer, a second epitaxial layer, and a third epitaxial layer, which together form the epitaxial feature. For example, a first epitaxial layer is formed on a seed that is the surface of the fin structure. In the case of etch back of block 202 being performed, the seed surface is the recessed top surface as illustrated by curvilinear surface 304A. A first epitaxial layer is formed from this seed area of surface 304A. Further as discussed below, a second epitaxial layer wraps around the first epitaxial layer using a seed of a surface/surfaces of the first epitaxial layer. In some further embodiments, a third epitaxial layer may further wrap around the prior epitaxial layer(s), for example, using a seed of a surface of the second epitaxial layer. The method may include additional epitaxial layers or fewer epitaxial layers. This multi-stage process is discussed in further detail below.

Figure 7D:
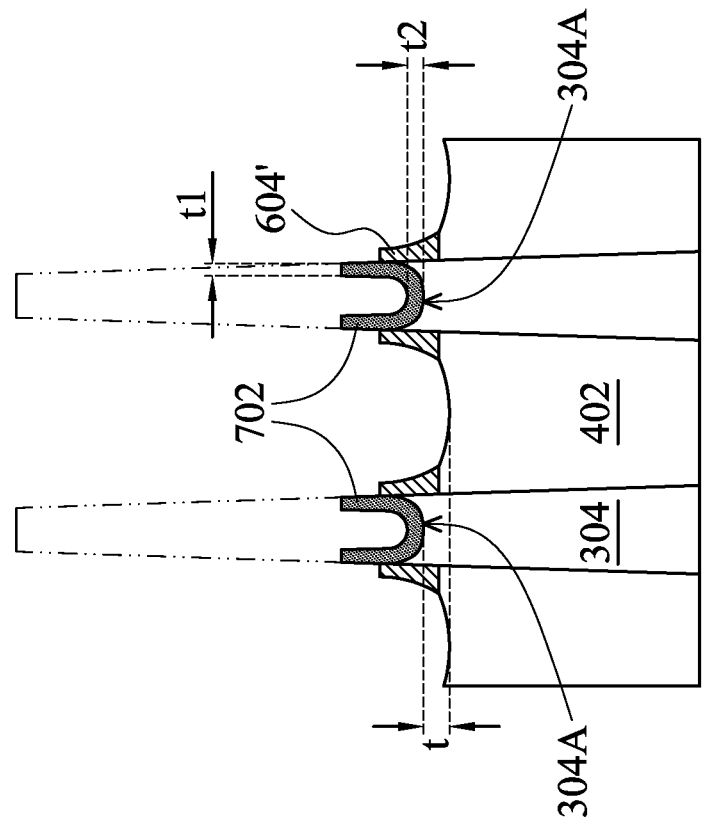
Figure 7C:
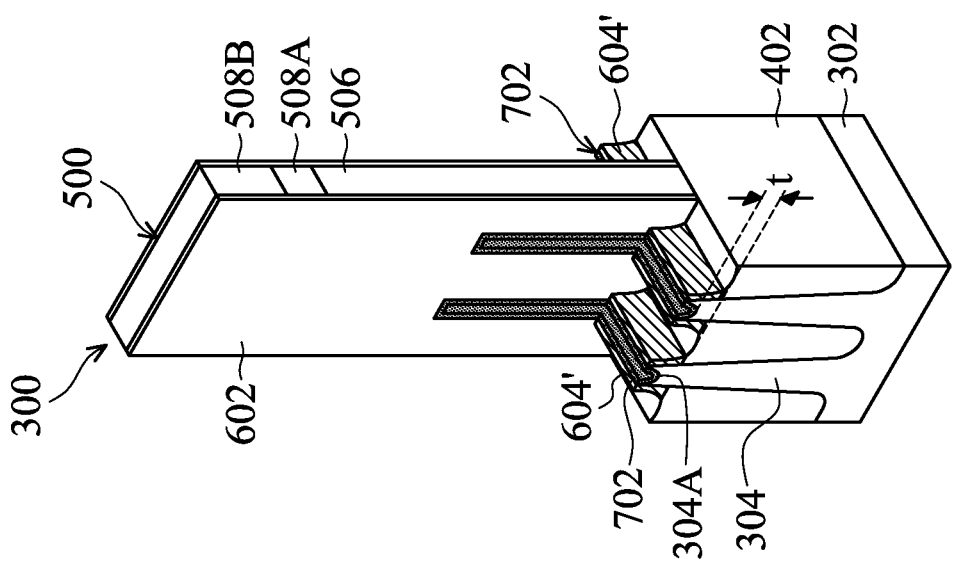

The method 200 then proceeds to block 204 where a first stage of epitaxial growth is performed. In an embodiment, the first stage of epitaxial growth is performed to form a first epitaxial portion 702, also referred to as L1 as illustrated in FIGS. 7C/7D. In an embodiment, the first epitaxial portion 702 is doped silicon such as, for example silicon doped with arsenic (As). In an embodiment, the first epitaxial portion 702 may include silicon doped with phosphorus or silicon phosphide (SiP). In some embodiments, the concentration of phosphorus is lower than that of the second and third epitaxial processes discussed below. In an embodiment, the concentration of phosphorus (P) is for a molar ratio of less than 2% with respect to the silicon precursor. In another embodiment, the first epitaxial portion 702 may be silicon or silicon carbide (SiC). In another embodiment, the first epitaxial portion 702 is silicon doped with arsenic (SiAs). A first epitaxy process can be implemented by CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. In an embodiment, the first epitaxial process (like blocks 206 and/or 208) is a VPE. In some implementations, first epitaxial portions 702 are doped during deposition by adding impurities to a source material of the epitaxy process. In some implementations, first epitaxial portions 702 are doped by an ion implantation process subsequent to a deposition process. In the depicted embodiment of FIG. 7A/7B, the first epitaxial portion 702 does not merge with epitaxial regions of the adjacent fins. The first epitaxial portion 702 may be approximately 1 to 10 nm in thickness. In an embodiment, the first epitaxial portion 702 includes a first thickness t1 at a sidewall and a second thickness t2 at a bottom region. The thickness t2 may be greater than the thickness t1. In an embodiment, the thickness t2 is between approximately 4 and 8 nm. In an embodiment, the thickness t1 is between approximately 2 and 4 nm. In an embodiment, the thickness t2 to the thickness t1 has a ratio of approximately 1.5:1 to approximately 4:1. While not being bound to any theory, the thickness difference may result from a single epitaxial growth process experiencing different growth rates depending on crystalline plane (e.g., faster growth on plane (100) on the bottom seed area or surface 304A. The dopant type, dopant quantity, and thicknesses of the first epitaxial portion 702 affect the conductivity of the region, the lattice mismatch (e.g., stress) between the first epitaxial portion 702 and the underlying fin 304, and the epitaxial growth rate and facet formation. For example, increased dopant concentration provides increased conductivity and greater lattice mismatch with respect to a silicon fin 304. The thickness t1 and t2 should be sufficient to provide an ordered crystalline feature, while excessive thicknesses can provide for undesired shapes of the overall epitaxial feature (e.g., lower merge point by greater growth for the first epitaxial portion 702).

The first epitaxial portion 702 may extend above a top surface of the fin spacers 604'. In an embodiment, the fin spacers 604' extend below a plane coplanar with the both of the first epitaxial portion 702. In an embodiment, the fin spacers 604' have an upper surface that is disposed at a region coplanar to between 40-60% of the height of the first epitaxial layer 702. The interface of the fin spacers 604' and the first epitaxial portion may provide for defining a desired U-shaped region and a desired blocking of the growth of the second epitaxial layer 802 from lower regions on the first epitaxial feature 702, which, for example, may provide for a lower merge point.

The method 200 then proceeds to block 206 where a second stage of epitaxial growth is performed. Referring to the example of FIGS. 8A/8B, in an embodiment, the second stage of epitaxial growth is performed to form a second epitaxial portion 802, also referred to as L2-1. In an embodiment, the second epitaxial portion 802 is doped silicon such as, for example silicon doped with phosphorus (SiP). In an embodiment, the first epitaxial portion 702 (L1) comprises SiP having a P doping concentration of about $5\times10^{20}$ to about $2\times10^{21}$ atoms/cm$^3$; and the second epitaxial portion 802 (L2) comprises SiP having a P doping concentration of about $2.8\times10^{21}$ to about $3.2\times10^{21}$ atoms/cm$^3$. In another embodiment, the first epitaxial portion 702 (L1) comprises SiAs having an As doping concentration of about $5\times10^{20}$ to about $5\times10^{21}$ atoms/cm$^3$; and the second epitaxial portion 802 (L2) comprises SiP having a P doping concentration of about $2.8\times10^{21}$ to about $3.2\times10^{21}$ atoms/cm$^3$. The dopant type and dopant quantity affect the conductivity of the region, the lattice mismatch (e.g., stress) between the first epitaxial portion 702 and the second epitaxial portion 802, and the epitaxial growth rate and facet formation. Too low of a dopant concentration provides insufficient carriers to form the device 300; too high of dopant concentration increases the lattice mismatch with the underlying layers among other possible concerns.

The second epitaxial portion 802 is grown from a seed that includes the surface of the first epitaxial portion 702. In an embodiment, the second epitaxial portion 802 grows from the inner surface and a portion of the outer surface of the U-shape first epitaxial portion 702 or sidewall of the residual fin adjacent the upper portion of the U-shaped first epitaxial portion. In a further embodiment, the second epitaxial portion 802 grows from a portion of the semiconductor surface that extends above the fin spacers 604'. In some implementations, second epitaxial portions 802 are doped (e.g., phosphorous) during deposition by adding impurities to a source material of the epitaxy process. In some implementations, second epitaxial portions 802 are doped by an ion implantation process subsequent to a deposition process. The second epitaxial portion 802 merges with second epitaxial portion 802 of the adjacent fin or fins. The merge point, merge area, and relative dimensions of the second epitaxial portion 802 are discussed further below. As discussed above, in an embodiment, the first epitaxial portion 702 wraps an upper active region of each fin structure 304 (e.g., where the first stage is performed without recessing the fin as described in block 202). In a further embodiment, the second epitaxial portion 802 is similarly formed on exposed surface of the first epitaxial portion 702. In such an embodiment, the second epitaxial portion 802 for one fin continues to merge with an adjacent second epitaxial portion 802. In such an embodiment, the merge point and relative dimensions may be substantially similar to as discussed below.

In an embodiment, the second epitaxy process is implemented using a vapor-phase epitaxy (VPE) process. In an embodiment, the second epitaxial process is performed in-situ with the first epitaxial process of block 204.

In an embodiment, the carrier gas of the second epitaxy process may include H2. In a further embodiment, the carrier gas of the second epitaxy process does not include N2. For example, in an embodiment the second epitaxy process includes a source gas(es) including silicon and phosphorus and a carrier gas including H2. In an embodiment, the source gas(es) include a silicon source such as silane, SiH4, or disilane, Si2H6. In an embodiment, the source gas(es) include a phosphorus source such as phosphine, PH3. In an embodiment, the pressure of the second epitaxial process is between approximately 20 Torr to 30 Torr. The carrier gas of H2 may provide for surface activation of the seed; this activation may be improved over that of N2 which may not interact with the seed. The H2 may interact with the dangling bonds on the surface of the first epitaxial portion 702 providing a faster epitaxial growth rate. The H2 carrier gas may in particular provide for a faster growth rate on the (100)Si oriented surface of the seed (the first epitaxial portion 702). The H2 carrier gas can assist in the disassociation of the silicon source gas (e.g., SiH4) rate. It is noted that the carrier gas is not a source gas and thus, does not provide elements to the grown second epitaxial portion 802. That is, the H2 carrier gas may be used to activate the surface, but the elemental hydrogen is not included in the grown epitaxial feature.

In an embodiment, the deposition temperature of the second epitaxy process may be higher than that of a standard epitaxy process (e.g., first epitaxy process). For example, in an embodiment, the second epitaxy process may include a temperature of approximately 690 to 730° C. In a further embodiment, the second epitaxy process may include a temperature of approximately 700 to 730° C. In comparison, the first epitaxial process (block 204) and/or the third epitaxial process (block 208) may be performed at a temperature of 670 to 690° C. In an embodiment, the second epitaxy process may be at least 100 degrees Celsius greater than the first epitaxy process and/or the third epitaxy process. The higher temperature may also provide for faster epitaxial growth in particular on the (100)Si oriented surface of the seed (the first epitaxial portion 702). In an embodiment, the second epitaxial process includes H2 carrier gas and the elevated temperature discussed above. The faster growth rate may allow for a higher merge point as the growth extends vertically. A lower growth rate provided by a lower temperature may provide a lower merge point due to relatively greater proportion of epitaxial growth in a lateral direction. The higher merge point the more air gap (dielectric) under merged source/drain features, which may reduce capacitance of the device.

Figure 8B:
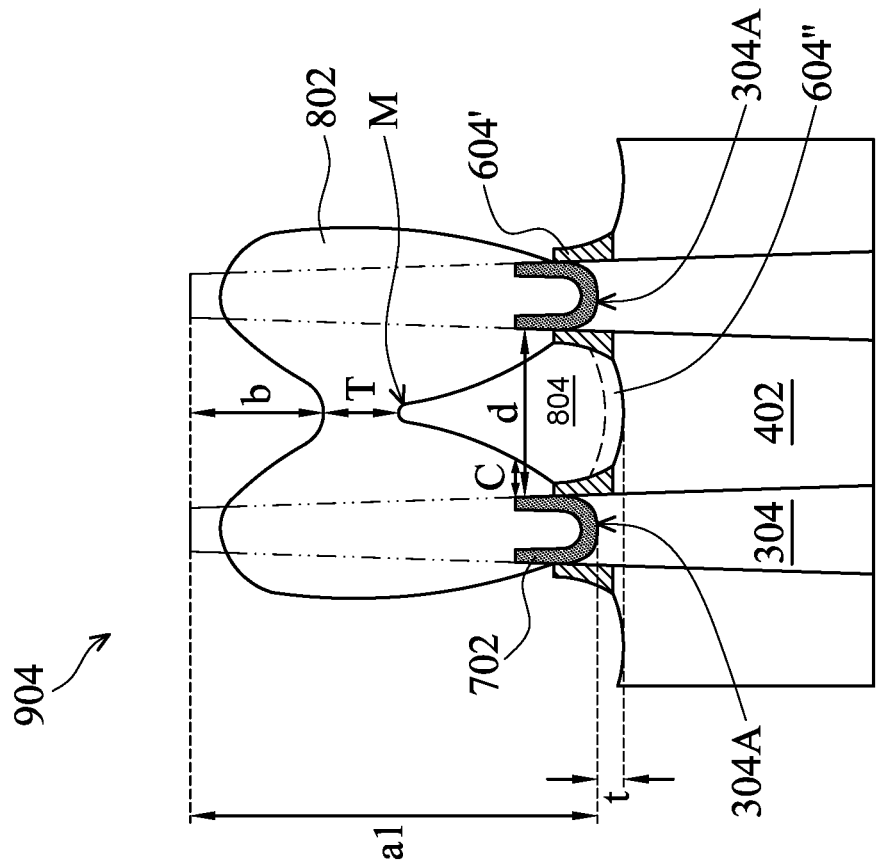
Figure 8A:
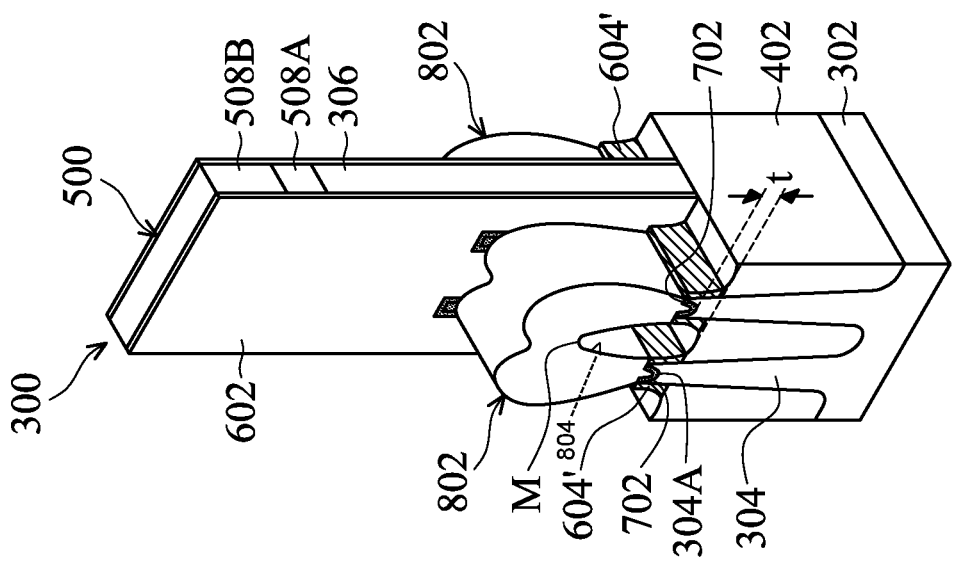

The highest point of the merged region of second epitaxial portions 802 is referred to as the merge point, annotated "M" in FIG. 8A/8B. In an embodiment, the second epitaxial process provides for a relatively higher merge point M between the second epitaxial portions 802 of adjacent fin structures 304 due to the increased growth on the (100) plane of the seed (e.g., temperature and carrier gas dependent). The higher merge point M provides for a taller gap (e.g., air gap) between the fin structures 304, above the isolation structure 402 and underlying the second epitaxial portions 802. This air gap 804 is provided by FIGS. 8A/8B. In an embodiment, the merge point M is at approximately 40%-60% of the height H of the fin structure 304 (above the surface 304A). The location of the merge point M can be tuned to determine the capacitance associated with the device. For example, a low merge point height can result in loss of performance for device capacitance. The higher merge point provides for capacitance reduction and improvement of device performance.

In an embodiment, the thickness T of the merged region above the merge point M may be between approximately 23.5 and 28.5 nm. In an embodiment, the distance from the isolation region 402 (top surface) to merge point M may be between approximately 30.5-34 nm. In an embodiment, these measurements are associated with a 65 nm critical dimension process node. In an embodiment, the ratio of the merged thickness T to the critical dimension CD (T/CD) may be between about 0.36 to 0.4. The thickness T affects the available carriers and conductivity between adjacent fins 304. For example, too small of a thickness T can lead to discontinuities and reduced interconnection (increased resistance) between adjacent epi features (i.e., left and right feature of second epitaxial portion 802).

FIG. 8B illustrates several additional dimensional illustrations that describe aspects of the second epitaxial portion 802. Distance a1 is a vertical distance between a top of the fin structure 304 and the bottom point of the first epitaxial portion 702 (e.g., surface 304A). Distance b is a length between a top of the fin structure 304 and a top point of the merge area between second epitaxial portions 802. If the distance b is too great, when the subsequent epitaxial layer is grown thereover, the planarity will be decreased. Distance C is a horizontal distance between a fin sidewall and an edge of the second epitaxial portion 802. The horizontal distance C is measured at a vertical height of 0.3*a1. Distance d is a measurement of a horizontal distance between adjacent two adjacent fin structures 304. The distance d may also be measured at a vertical height of 0.3*a1. The distance d affects the pitch of the devices including device 300, the greater the distance d the greater the pitch and the less devices per area of the substrate.

In an embodiment, the second epitaxial feature 802 has a merge top point location at a ratio of b/a1, where b/a1 is between approximately 0.15-0.25. In an embodiment, the second epitaxial feature 802 has a bottom epitaxial lateral ratio (C*2/d) of between approximately 0.15 and 0.45. If the ratio of the b/a1 is too large, this may impact ability to form a third epitaxial layer having sufficient planarity of the resultant epitaxial feature. These features exemplify the advantages of some embodiments of the method 200 and block 206 in particular, that is that the merge top point is higher than features formed by other processes such that the top shape of the second epitaxial portion 802 is flatter (i.e., distance b is less). The above dimensions provide benefits to the device 300 including as discussed above and below. Should the dimension C be greater, the merge point M will be lower. A higher merge point M can reduce the capacitance of the device. The merge point M is above a top surface of the fin spacers 604'. In an embodiment, there is no fin spacer 604' on the inner sidewalls of the fin 304 and there is a fin spacer 604' on the outer sidewall of the fin 304. In a further embodiment, the merge point M is above a top surface of the fin spacer 604' on the outer sidewall. In an embodiment, there is a fin spacer 604' on the inner and/or outer sidewalls and the merge point (M) is approximately 10-20 nanometers above a top surface of the fin spacer 604'.

In an embodiment, two inner spacers may connect to one another forming a dielectric region having a U-shape. See dashed line 604" in FIG. 8B. In an embodiment, the merge point M is at least 20 nm above a lowest point in the U-shape of the fin spacers 604". In an embodiment, the merge point M is between 20-40 nm above a lowest point in the U-shape of the fin spacers 604". Thus, the air gap formed between the epitaxial feature 904 (see below) and the nearest dielectric material (e.g., fin spacers 604" or isolation feature 402) may be at least 20 nm, or between approximately ⅓ and ⅔ of the fin height above the surface 304A. As discussed above, the distance between the merge point M and the fin spacers 604" affect the height of the air gap and thus, the capacitance of the device. An increased air gap provides improved capacitance performance of the device.

The method 200 then proceeds to block 208 where a third stage of epitaxial growth is performed. Referring to the example of FIGS. 9A/9B, in an embodiment, the third stage of epitaxial growth is performed to form a third epitaxial portion 902, also referred to as L2-2. In an embodiment, the third epitaxial portion 902 is doped silicon such as, for example silicon doped with phosphorus (SiP). In an embodiment, the third epitaxial portion 902 comprises SiP having a P doping concentration of about $3.8\text{-}4.2 \times 10^{21}$ atoms/cm$^3$. In an embodiment, the third epitaxial portion 902 has a dopant concentration (P) greater than the second epitaxial portion 802.

The third epitaxial portion 902 is grown from a seed that includes the surface of the second epitaxial portion 802. The third epitaxial portion 902 is grown from all exposed surfaces of the second epitaxial portion 802, such that the third epitaxial portion 902 follows the outline of the second epitaxial portion 802. In some implementations, third epitaxial portions 902 are doped during deposition by adding impurities to a source material of the epitaxy process. In some implementations, third epitaxial portions 902 are doped by an ion implantation process subsequent to a deposition process.

In an embodiment, the third epitaxy process is implemented using a vapor-phase epitaxy (VPE) process. In an embodiment, the third epitaxial process is performed in-situ with the second epitaxial process of block 206. In an embodiment, the third epitaxial process is performed at a lower temperature than the second epitaxial process. In an embodiment, the carrier gas of the third epitaxy process (and also, in some embodiments, the first epitaxy process) includes N2. In a further embodiment, the carrier gas of the third epitaxy process does not include H2. For example, in an embodiment the second epitaxy process includes a source gas(es) including silicon and phosphorus and a carrier gas including N2. In an embodiment, the source gas(es) include a silicon source such as silane, SiH4, or disilane, Si2H6. In an embodiment, the source gas(es) include a phosphorus source such as phosphine, PH3.

Figure 9B:
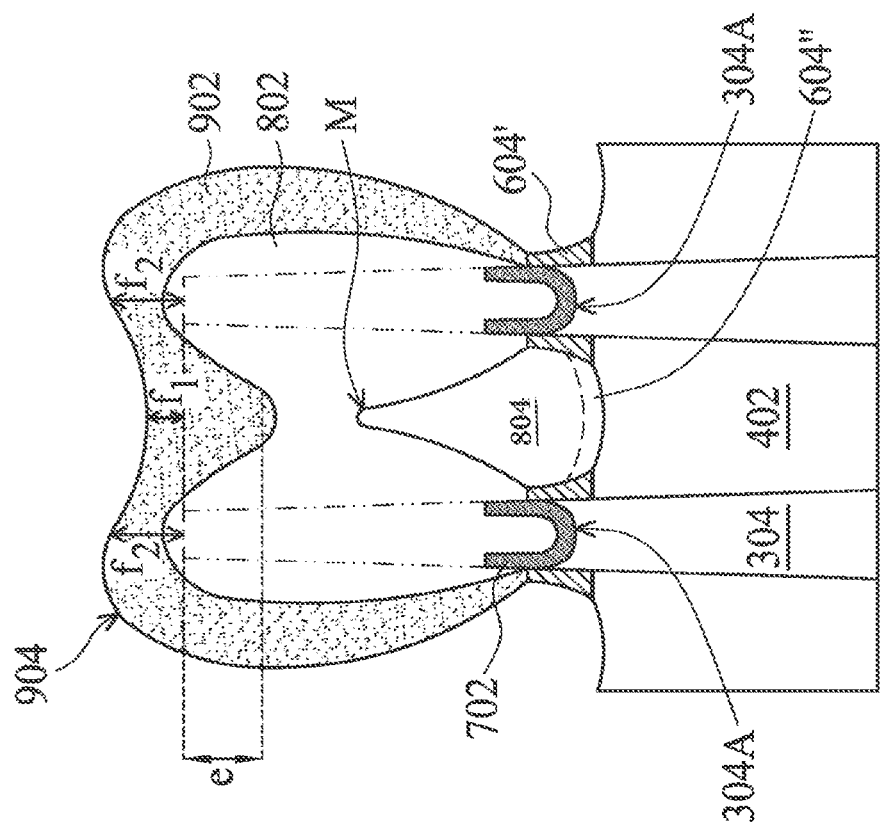

FIG. 9B illustrates several dimensional illustrations that show certain aspects of the third epitaxial portion 902. The distance e is defined a distance down from the top of the fin structure 304 that is equal to about ⅕ of the height of the epitaxial feature formed by epitaxial portions 702, 802, 902. The top portion of the second epitaxial portion 802 is slightly below the distance e, while the top portion of the third epitaxial portion 902 (and thus, the structure 904) is above the distance e. Further, the top surface of the third epitaxial portion 902 is a distance f2 from the top of the fin 304 and regions directly overlying the fin 304. The distance f2 is a positive value when measured in a first direction, the first direction extending along the height of the fin. The top surface of the third epitaxial layer is a distance f1 from a plane coplanar with a top of the fin 304 to a top of the third epitaxial portion 902 measured directly overlying the isolation regions 402 and/or the merge point M. It is noted that the distance f1 is a positive distance in the first direction, or in other words, the distance f1 is measured in a distance above the top of the fin 304. In an embodiment, the ratio of height variation of the epitaxial feature 904 is (f1/f2) is between approximately 0.5 and 0.9. Because f1 and f2 are positive distances in the first direction, this ratio is a positive number. Should f1 be decreased (e.g., nearer 0 or even negative) or the ratio of f1/f2 further from 1.0, the planarity of the epitaxial feature 904 surface is decreased.

In an embodiment, the dimensions f1 and f2 define not only the distance to the top of the third epitaxial portion 902 but define the outermost surface of the epitaxial feature 904.

Figure 9A:
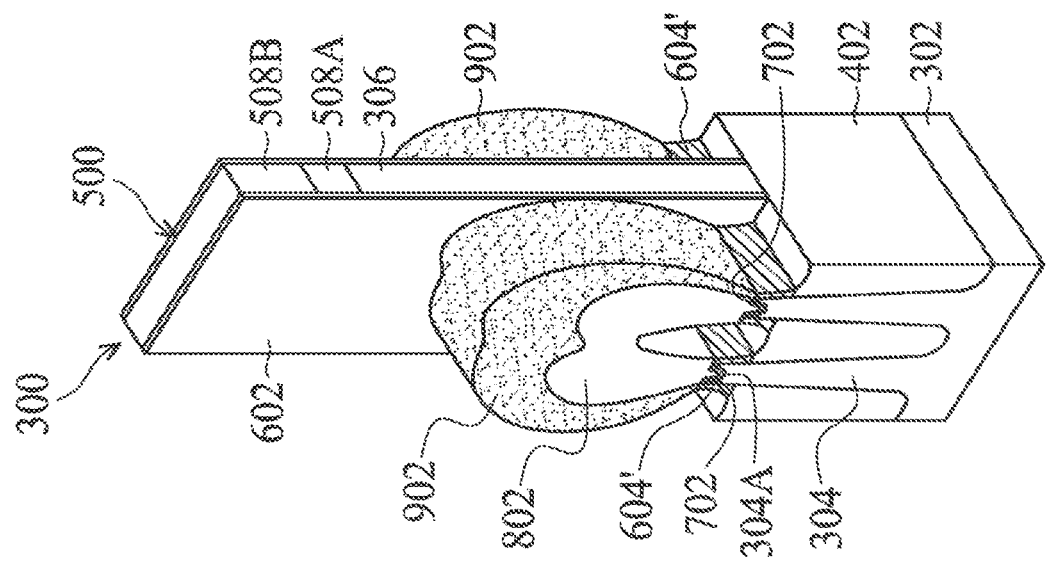
Figure 10:
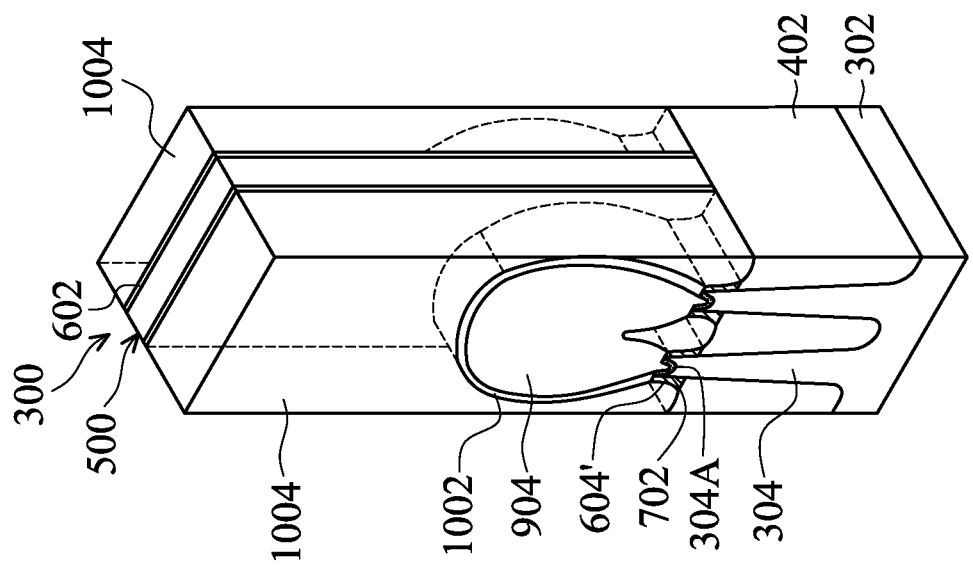

As illustrated in exemplary figures including FIGS. 9A/9B, the method 200 may be used to form an epitaxial feature 904 that includes the first epitaxial portion 702, the second epitaxial portion 802, and the third epitaxial portion 902. Additional epitaxial layers may also be formed. The epitaxial feature 904 is a merged epitaxial feature. A merged epitaxial feature as described herein provides for the epitaxial feature to extend from one fin to an adjacent fin. While a merged epitaxial feature is illustrated between two fins, a merged epitaxial feature may extend to interface any number of fins. The merged epitaxial feature is referred to as such as the epitaxial growth described herein initiates from a seed surface on at least two fins and through the epitaxial growth joins at least one point such that the epitaxy is laterally merged in a first direction (parallel the gate). It is noted that the first epitaxial layer may not be merged but a second epitaxial layer may be merged.

The epitaxial feature 904 provides a source/drain for FinFET device 300. In an embodiment, the epitaxial feature 904 is suitably doped for a n-type FinFET device 300. In some embodiments, the first epitaxial portion 702 includes a first dopant concentration, the second epitaxial portion 802 includes a second dopant concentration, and the third epitaxial portion 902 includes a third dopant concentration. The first dopant concentration may be less than the second dopant concentration; the second dopant concentration may be less than the third dopant concentration. The increasing dopant concentration may serve to provide the appropriate functionality to the device 300 while also reducing the resistance of the source/drain formed by the epitaxial feature 904. In some embodiments, the method 200 may continue to provide an anneal process.

The epitaxial feature 904 may provide advantageous over that of other embodiments of source/drain features. As illustrated by the dimensional description above, the epitaxial feature 904 has a relatively flat upper surface of interfacing with the above feature (e.g., contact). That is f1 is a positive dimension substantially close to the length of f2 such that f1/f2 is greater than about 0.5 or that f1 is at least 50% of the length of f2. This increased planarity of the epitaxial feature 904 may allow for yield improvement for contact element landing on the epitaxial feature 904 to provide electrical contact to the source/drain feature of the device.

The epitaxial feature 904 also illustrates that the merge point M is increased in height from other embodiments of source/drain features. As illustrated by the dimensional description above, the epitaxial feature 904 has a larger air gap 804. The lateral spread of the second epitaxial portion 802 is less than half of the distance between fins 304 (see c). As the growth of the third epitaxial portion 902 in the air gap is essentially none (due to the merged region preventing source gases from entering the air gap), this distance is maintained in the epitaxial feature 904.

Returning to the method 100 of FIG. 1, after formation of the source/drain regions in block 108, the method 100 may proceed to block 110 where a contact etch stop layer (CESL) and/or an inter-layer dielectric (ILD) layer are formed. Referring to the example of FIG. 10, in an embodiment of block 110, a CESL 1002 and an ILD layer 1004 are formed over the substrate 302. The ILD layer 1004 may be disposed over the CESL 1002. In some examples, the CESL 1002 includes a silicon nitride layer, silicon oxide layer, a silicon oxynitride layer, and/or other materials known in the art. The CESL 1002 may be formed by CVD, ALD, or other suitable process. In some embodiments, the ILD layer 1004 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1004 may be deposited by CVD, ALD, or other suitable process. In some embodiments, after formation of the ILD layer 1004, an anneal process may be performed to anneal the ILD layer 1004. In some examples, after deposition of the CESL 1002 and the ILD layer 1004, a planarization process may be performed to expose a top surface of the gate structure 500. The planarization process may include a chemical mechanical planarization (CMP) process which removes portions of the CESL 1002 and/or the ILD layer 1004 overlying the gate structure 500 and planarizes a top surface of the semiconductor device 300. The CMP process may also remove the hard mask 508 of the gate structure 500 including the oxide layer 508A and the nitride layer 508B to expose the gate electrode 506, which may include a polysilicon layer, as discussed above.

The method 100 then proceeds to block 112 where, in some embodiments, the gate structure formed in block 106 is removed for a replacement by a functional metal gate structure. In the embodiment, the dummy gate structure is removed and replaced with a metal gate electrode. In some embodiments, the gate dielectric layer and/or interfacial layers are also removed and replaced. Referring to the example of FIG. 11A, in an embodiment of block 112, the dummy gate electrode portion may be removed from the substrate. The removal of the gate electrode layer 506 may be performed using a selective etching process such as a selective wet etch, a selective dry etch, or a combination thereof. In some embodiments, the gate electrode layer 506, dielectric layers 502, 504 are removed. After forms an opening, a metal gate electrode 1104 may be formed in the trench, as shown in FIG. 11A, to form a final gate structure 500'.

In various examples, the metal gate electrode 1104 may include a metal, metal alloy, or metal silicide. The metal gate electrode 1104 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal gate electrode 1104 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal gate electrode 1104 may provide an N-type work function, may serve as a transistor (e.g., FinFET) gate electrode. In various embodiments, the metal gate electrode 1104 may be formed by ALD, PVD, CVD, e-beam evaporation, or other suitable process. Further, the metal gate electrode 1104 may be formed separately for N-FET and P-FET transistors which may use different metal layers. In various embodiments, a CMP process may be performed to remove excessive metal from the metal gate electrode 1104, and thereby provide a substantially planar top surface of the metal gate electrode 1104 and of the device 300.

The gate structure 500' may further include a gate dielectric layer 1106 and/or an interfacial layer 1108. The gate dielectric layer 1106 may be substantially similar to as discussed above with reference to layer 504. In some embodiments, the gate dielectric layer 1106 is a high-k dielectric material such as hafnium oxide ($HfO_2$), HfZrO, $TiO_2$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The interfacial layer 1108 may include an oxide such as silicon oxide, silicon oxynitride or other suitable material.

The method 100 may then proceed to block 114 where contact elements are formed to the source/drain features and/or the gate structure. In some embodiments, an opening is formed in the ILD layer 1004 over the epitaxial feature 904. The opening may be performed by patterning a hard mask or photoresist masking element to define the opening and etching the ILD layer 1004 through the opening. Patterning may also be implemented or replaced by other proper methods, such as maskless photolithography, electron-beam writing, ion-beam writing, and molecular imprint. The removing process to form the opening may include a plasma etch, a reaction ion etch (RIE), a dry etch, a wet etch, another proper removing process, or combinations thereof.

A contact fill metal or metals are then formed in the opening and interfacing the epitaxial features 904. Various deposition process may be applied to deposit material forming the contacts 1102. For example, the deposition of the copper may include PVD to form a seed layer and plating to form bulk copper on the copper seed layer. In some embodiments, prior to filling conductive material in contact openings, silicide may be formed on the epitaxial features 904 to further reduce the contact resistance. In some embodiments, the silicide may convert a portion of the third epitaxial portion 902 to a silicide. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal. Filling the contact openings form conductive contact features 1102 as illustrated in FIGS. 11A, 11B, and the top view of FIG. 11C.

As depicted in FIGS. 9B and 11B, contact 1102 advantageously contacts a top surface of the epitaxial feature 904 that is substantially planar. This allows for proper landing of the contact 1102 onto the epitaxial feature 904 and suitable interface between the features reducing contact resistance.

The semiconductor device 300 may undergo further processing to form various features and regions known in the art. For example, subsequent processing may form additional interlayer dielectric (ILD) layer(s), additional contacts/vias/lines and multilayers interconnect features (e.g., metal layers and interlayer dielectrics) on the substrate 302, configured to connect the various features to form a functional circuit that may include one or more FinFET devices including FinFET device 300. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Thus, the methods 100 and 200 and the associated exemplary devices 300 provide in some embodiments for an improved structural configuration of the source/drain of a FinFET device and/or improvements in the interface between the contact structure and the epitaxial feature forming the source/drain of a FinFET device. Some embodiments provide a method of forming the epitaxial feature that allows for a higher merge point, increasing the air gap (dielectric) under merged source/drain features, which may reduce capacitance of the device. Some embodiments provide for a merged epitaxial feature with a more planar top surface allowing for a more uniform landing area for the contact element.

Thus, one of the embodiments of the present disclosure described a method that includes forming a first fin structure and a second fin structure extending from a substrate. A gate structure is formed over the first fin structure and the second fin structure. An epitaxial feature is form over the first fin structure and the second fin structure. Forming the epitaxial feature includes growing a first epitaxial feature having a first portion over the first fin structure and a second portion over the second fin structure, growing a second epitaxial feature over the first and second portions of the first epitaxial feature, and growing a third epitaxial feature over the second epitaxial feature. The second epitaxial feature includes a merged portion between the first fin structure and the second fin structure.

In a further embodiment, growing the second epitaxial feature uses hydrogen (H2) as a carrier gas. In another embodiment, the growing the second epitaxial feature includes a silicon source and a phosphorus source and the carrier gas. In an embodiment, growing the second epitaxial feature is performed at a first temperature of between about 690 and 730 degrees Celsius.

In a further embodiment, growing the first epitaxial feature is performed a second temperature less than the first temperature. A first distance between an upper point on the merged portion and a top of the first fin structure divided by a height of the first fin structure over an isolation structure extending between the first fin structure and the second fin structure may be between about 0.15 and 0.25.

In an embodiment, prior to forming the epitaxial feature, each of the first fin structure and the second fin structure are recessed to form a recessed surface for each of the first fin structure and the second fin structure. The first epitaxial feature is grown from the recessed surfaces. The first epitaxial feature may have a U-shape.

In an embodiment, growing the second epitaxial feature includes forming the second epitaxial feature doped with phosphorus. In an embodiment, growing the first epitaxial feature includes growing a U-shaped feature that extends above an adjacent fin spacer.

In another of the embodiments, discussed is a method including forming a first fin structure and a second fin structure extending from a substrate and having an isolation region interposing the first fin structure and the second fin structure. A gate structure is formed over each of the first fin structure and the second fin structure. A source/drain feature is formed adjacent the gate structure. Forming the source/drain feature includes growing a first epitaxial feature having a first portion over the first fin structure and a second portion over the second fin structure. A second silicon phosphorus (SiP) epitaxial feature is grown over the first and second portions of the first epitaxial feature. Growing the second SiP epitaxial feature uses an H2 carrier gas. The second silicon phosphorus epitaxial feature includes a merged portion between the first fin structure and the second fin structure. A third epitaxial feature is grown over the second SiP epitaxial feature. A contact element is formed to the third epitaxial feature.

In a further embodiment, growing the first epitaxial feature includes growing a SiP epitaxial feature using an N2 carrier gas. Growing the third epitaxial feature may further include growing a SiP epitaxial feature using an N2 carrier gas. In an embodiment, growing the second silicon phosphorus (SiP) epitaxial feature is performed at a higher temperature than the growing the first epitaxial feature. In an embodiment, growing the second SiP epitaxial feature includes a silicon source gas, a phosphorus source gas, and the H2 carrier gas. Growing the second SiP epitaxial feature may in some cases include a vapor-phase epitaxy process. In an embodiment, growing the third epitaxial feature includes forming a top surface of the source/drain feature that extends from over the first fin structure to over the second fin structure. The top surface of the source/drain feature is entirely above a plane defined by a top surface of the first fin structure.

In another embodiment, discussed is a semiconductor device having a first fin structure and a second fin structure extending from a substrate and having an isolation region interposing the first fin structure and the second fin structure. A gate structure is over a first region of a top surface of each of the first fin structure and the second fin structure. A silicon phosphorus (SiP) epitaxial source/drain feature is disposed adjacent the gate structure. The SiP epitaxial source/drain feature extends over the first fin structure and the second fin structure. The SiP epitaxial source/drain feature includes a top surface above the isolation region between the first and second fin structures above the first region of the top surface of the first fin structure and the second fin structure.

In a further embodiment, the SiP epitaxial source/drain feature has a merge point between the isolation region and the top surface of the SiP epitaxial source/drain feature. In some embodiments, the merge point is approximately 40%-60% of a height of the first fin structure above a bottom of the SiP epitaxial source/drain feature. In a further embodiment, spacers elements interface a bottom of the SiP epitaxial source/drain feature. In some implementations, a contact structure interfaces the top surface of the SiP epitaxial source/drain feature. In an embodiment, a bottom of the SiP epitaxial source/drain feature interfaces a recessed portion of the first fin structure and a recessed portion of the second fin structure. In some implementations, a top surface of the isolation region is concave.

In yet another of the embodiments, discussed is a semiconductor device. The device includes a substrate including a first fin element and a second fin element extending from the substrate, an isolation structure extending between the first fin element and the second fin element, a gate structure formed over the first fin element and the second fin element; and a source/drain feature adjacent the gate structure and over the first fin element and the second fin element. The source/drain feature has a top surface having a first height above a plane defined by a top surface of the first fin element and a second height above the plane, and a third height above the plane. The first height is defined over the first fin element and the third height is defined over the second fin element. The second height is defined over the isolation structure. A ratio of the third height to the first height is approximately 0.5 to 0.9.

In a further embodiment, an air gap is disposed under the source/drain feature. The air gap may extend to a merge point that is approximately 40%-60% of a height of the first fin element above a bottom of the source/drain feature. The third height is measured at a point vertically aligned with the merge point. In a further embodiment, the source/drain feature includes three silicon epitaxial portions each having a different phosphorus doping concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first fin structure and a second fin structure extending vertically from a substrate and along a first direction in a top view and having an isolation region interposing the first fin structure and the second fin structure in the first direction, wherein an upper surface of the isolation region has a concave region, and the upper surface of the isolation region has a substantially planar region underlying a spacer element abutting the first fin structure;
    a gate structure over a first region of a top surface of each of the first fin structure and the second fin structure, the gate structure extending in a second direction in the top view, the second direction perpendicular to the first direction; and
    a silicon phosphide (SiP) epitaxial source/drain feature adjacent the gate structure, wherein the silicon phosphide (SiP) epitaxial source/drain feature extends over the first fin structure and the second fin structure, wherein the SiP epitaxial source/drain feature includes a top surface above the isolation region between the first and second fin structures higher than the first region of the top surface of the first fin structure and the second fin structure, the SiP epitaxial source/drain feature including:
        a first region disposed over the first fin structure having a first phosphorus concentration, wherein the first region has a U-shape disposed above the first fin structure in a cross-sectional view extending in the second direction spaced a distance from the gate structure;
        a second region disposed over the first region, the second region having a second phosphorus concentration, the second phosphorus concentration greater than the first region; and
        a third region disposed over the second region, the third region having a third phosphorus concentration.

2. The semiconductor device of claim 1, wherein the SiP epitaxial source/drain feature has a merge point between the isolation region and the top surface of the SiP epitaxial source/drain feature.

3. The semiconductor device of claim 2, wherein the merge point is approximately 40%-60% of a height of the first fin structure above a bottom of the SiP epitaxial source/drain feature.

4. The semiconductor device of claim 1, further comprising: spacers elements interfacing the first region of the SiP epitaxial source/drain feature.

5. The semiconductor device of claim 1, further comprising: a contact structure interfacing the top surface of the SiP epitaxial source/drain feature, the top surface being of the third region of the SiP epitaxial source/drain feature.

6. The semiconductor device of claim 1, wherein the first region of the SiP epitaxial source/drain feature interfaces a recessed portion of the first fin structure such that the U-shape interfaces a curved upper surface of the recessed portion.

7. The semiconductor device of claim 1, wherein the upper surface of the isolation region directly interfaces the spacer element abutting the first fin structure.

8. A semiconductor device, comprising:
    a substrate including a first fin element and a second fin element extending from the substrate;
    an isolation structure extending between the first fin element and the second fin element;
    a gate structure formed over the first fin element and the second fin element; and
    a source/drain feature adjacent the gate structure and over the first fin element and the second fin element, wherein the source/drain feature has a top surface having a first height above a plane defined by a top surface of the first fin element and a second height above the plane, and a third height above the plane, wherein the first height is defined over the first fin element and the third height is defined over the second fin element, and the second height is defined over the isolation structure, wherein a ratio of the second height to the first height is approximately 0.5 to 0.9, and wherein the source/drain feature includes three portions each having a different phosphorus doping concentrations.

9. The semiconductor device of claim 8, further comprising: an air gap under the source/drain feature, wherein the air gap extends to a merge point that is approximately 40%-60% of a height of the first fin element above a bottom of the source/drain feature.

10. The semiconductor device of claim 9, wherein the second height is measured at a point vertically aligned with the merge point.

11. The semiconductor device of claim 8, wherein the three portions of the source/drain feature each having the different phosphorus doping concentration together provide a lower phosphorus concentration nearer the first fin element and a higher phosphorus concentration near an upper surface of the source/drain feature.

12. A semiconductor device, comprising:
    a first fin structure and a second fin structure each extending from a substrate;
    an isolation region interposing the first fin structure and the second fin structure;
    fin spacers on the isolation region and abutting the first fin structure and the second fin structure;
    a gate structure over each of the first fin structure and the second fin structure; and
    a source/drain feature adjacent the gate structure and on the first fin structure and the second fin structure, wherein the source/drain feature is a Si:P feature including three regions:
        a first region having a first concentration of phosphorus, wherein the first region has a bottommost surface higher than a plane extending from an uppermost surface of the isolation region;
        a second region on the first region and having a second concentration of phosphorus, the second concentration of phosphorus higher than the first concentration of phosphorus; and
        a third region on the second region and having a third concentration of phosphorus, the third concentration of phosphorus higher than the second concentration of phosphorus, wherein each of the first region, the second region and the third region interface a portion of the fin spacers.

13. The semiconductor device of claim 12, wherein the third concentration is Si:P having a P doping concentration of about $3.8\text{-}4.2\times10^{21}$ atoms/cm$^3$.

14. The semiconductor device of claim 13, wherein the second concentration is Si:P having a P doping concentration of about $2.8\times10^{21}$ to about $3.2\times10^{21}$ atoms/cm$^3$.

15. The semiconductor device of claim 14, wherein the first concentration is Si:P having a P doping concentration of about $5 \times 10^{20}$ to about $2 \times 10^{21}$ atoms/cm$^3$.

16. The semiconductor device of claim 12, wherein the first region having the first concentration has a U-shape.

17. The semiconductor device of claim 12, further comprising:
   a contact structure over the source/drain feature, wherein the contact structure interfaces the third region of the Si:P feature.

18. The semiconductor device of claim 12, wherein the Si:P feature has a merge point over the isolation region, and wherein the merge point is in the second region.

19. The semiconductor device of claim 18, further comprising: an air gap below the merge point and above the isolation region.

20. The semiconductor device of claim 12, wherein the isolation region between the first fin structure and the second fin structure includes a curvilinear surface.

\* \* \* \* \*